US007830152B2

United States Patent
Diab

(10) Patent No.: US 7,830,152 B2
(45) Date of Patent: Nov. 9, 2010

(54) SYSTEM AND METHOD FOR ENHANCED ACCURACY IN CABLE DIAGNOSTICS OF CABLE LENGTH

(75) Inventor: Wael William Diab, San Francisco, CA (US)

(73) Assignee: Broadcom Corporation, Irvine, CA (US)

( * ) Notice: Subject to any disclaimer, the term of this patent is extended or adjusted under 35 U.S.C. 154(b) by 368 days.

(21) Appl. No.: 11/844,497

(22) Filed: Aug. 24, 2007

(65) Prior Publication Data

US 2009/0049937 A1    Feb. 26, 2009

(51) Int. Cl.
*H04B 3/28* (2006.01)
*G06F 15/00* (2006.01)

(52) U.S. Cl. ............... 324/533; 333/12; 702/199
(58) Field of Classification Search .......... 324/533; 333/12; 702/199
See application file for complete search history.

(56) References Cited

U.S. PATENT DOCUMENTS 5,128,619 A * 7/1992 Bjork et al. ............ 324/533
5,894,223 A * 4/1999 Medelius et al. ....... 324/529
6,507,592 B1 * 1/2003 Hurvig et al. .......... 370/503
6,898,185 B1 * 5/2005 Agazzi et al. .......... 370/241

OTHER PUBLICATIONS

Michael J. Teener, "Ethernet AV™ Summary," Apr. 2006.
Michael J. Teener, "AV Bridging and Ethernet AV™," Mar. 2007.

* cited by examiner

*Primary Examiner*—Timothy J Dole
*Assistant Examiner*—Farhana Hoque
(74) *Attorney, Agent, or Firm*—Duane S. Kobayashi

(57) ABSTRACT

A system and method for enhanced accuracy in cable diagnostics of cable length. Conventional cable diagnostics such as time domain reflectometry can be used to determine cable length. This conventional technique can have accuracy limitations in certain situation such as with perfectly terminated cable. A cable length can also be determined through the use of link delay measurements that are based on clock synchronization between nodes in a network. Notwithstanding the accuracy issues of these link delay measurements, overall accuracy can be increased through the combination of the two cable length delay measurements into a final estimate.

20 Claims, 3 Drawing Sheets

SYSTEM AND METHOD FOR ENHANCED ACCURACY IN CABLE DIAGNOSTICS OF CABLE LENGTH

BACKGROUND

1. Field of the Invention

The present invention relates generally to Ethernet networks and, more particularly, to a system and method for enhanced accuracy in cable diagnostics of cable length.

2. Introduction

Cable diagnostic play a key role in the management of various networks. Various forms of cable diagnostics can be used to detect and identify cable faults, cable length, cable topologies, etc. An identification of cable length is particularly useful in determining the potential performance of a link over that cable, which enables diagnostics and/or enables other applications.

To illustrate such an impact, consider an example application such as power over Ethernet (PoE). In a PoE application such as that described in the IEEE 802.3af and 802.3at specifications, a power sourcing equipment (PSE) delivers power to a powered device (PD) over Ethernet cabling. Various types of PDs exist, including voice over IP (VoIP) phones, wireless LAN access points, Bluetooth access points, network cameras, computing devices, etc. In an enterprise network, various PDs can be deployed on a permanent or non-permanent basis at various locations (e.g., conference rooms) situated throughout the enterprise facility.

In powering these various PDs, a key piece of information is the length of the cable between the PSE and the PD. In one example, this length information can be used to calculate or otherwise determine a resistance of the cable link. The resistance of the cable link in turn can be used to identify a voltage drop and/or power loss that can be attributed to the cable link. For a given PD deployment, the voltage drop and/or power loss can play a key role in the determination and allocation of an accurate power budget attributable to that port. As the resistance of the cable is proportional to the length of the cable, an accurate determination of the cable length is critical to any calculations or assessments that are based on the resistance of the cable link.

As would be appreciated, the determined length of the cable can be useful in various diagnostic capacities either alone or in combination with the particular needs of a given application. There are many applications beyond PoE that can use the cable length information. What is needed therefore is a mechanism that enables enhanced accuracy in the cable diagnostics of cable length.

SUMMARY

A system and/or method for enhanced accuracy in cable diagnostics of cable length, substantially as shown in and/or described in connection with at least one of the figures, as set forth more completely in the claims.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
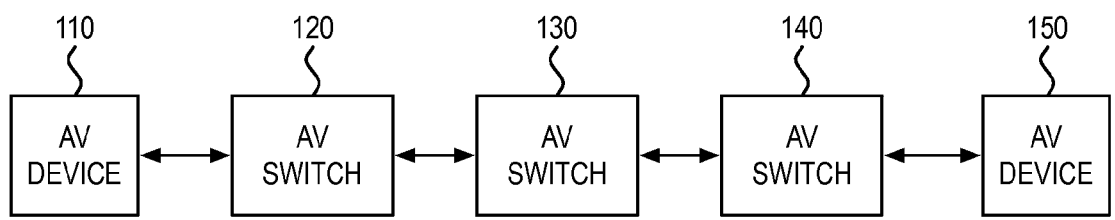
FIG. 1 illustrates an example of an Ethernet network that enables connectivity of client and server devices.

Various embodiments of the invention are discussed in detail below. While specific implementations are discussed, it should be understood that this is done for illustration purposes only. A person skilled in the relevant art will recognize that other components and configurations may be used without parting from the spirit and scope of the invention.

In a conventional cable diagnostic process, the length of a cable between two network devices can be determined through an identification of discontinuities in the cable. For example, time domain reflectometry (TDR) performed by a physical layer device (PHY) can be used to detect those discontinuities through the measurement of reflections of a signal that is injected into the cable. Here, the time interval between launching the injected signal and receiving a reflection of the injected signal is linearly proportional to the cable length. The cable length can then be computed by multiplying the media propagation speed with the identified time interval. The calculated result is then divided by two to account for the round-trip delay of the measured signal.

In some situations, the cable length that is calculated using the TDR measurements can be inaccurate. This can result, for example, where the cable is perfectly terminated at the other end of the link. As noted, these inaccuracies can significantly impact applications such as PoE that rely on cable length information for configuration purposes.

Another mechanism by which cable length can be determined is through link delay measurements. These link delay measurements can be based on messages that are passed between network devices that have an established common time reference. This common time reference enables network devices to use timestamps that are derived, in effect, from the same source clock. By including a timestamp in a message, the receiving network device is able to identify a time of transmission of the message. The difference between the time of transmission and the time of reception can provides an estimate of the time of flight of the message. This time of flight can be used to estimate a distance in the link. As would be appreciated, calculations based on a round trip time of flight can be used to generate a better estimate of the length of the cable link.

In one embodiment, the common time reference between network devices can be established as part of a connection reservation protocol such as audio/video (AV) bridging, which can be applied to AV streaming across the network. In general, AV bridging such as that described in IEEE 802.1 has been developed to reserve a connection with a certain quality of service (QoS). In this process, a bandwidth reservation protocol and a time synchronization protocol would be implemented to reserve a connection with guaranteed levels of bandwidth and latency.

Latency, in particular, is a significant issue and would require the periodic exchange of timing information that would allow both ends of the link to synchronize their time-of-day clock precisely. In one embodiment, different granularities can be used to meet different traffic classes. For example, 125 μs periods (used in most current isochronous transports) can be used for low latency streams, while 1 ms periods can be used for moderate latency streams.

During link establishment, AV devices would exchange capability information. If the devices have the same network synchronization capability, the devices would then exchange configuration and clock synchronization information. Bridges between the devices would similarly be involved in the exchange of configuration and synchronization information. If all links in the connection between the devices can support network synchronization, then the connection having a certain QoS can be reserved. In contrast, if one of the links in the connection between the devices cannot support network synchronization, then the connection having a certain QoS cannot be reserved.

FIG. 1 illustrates an example of a connection between AV devices 110 and 150. In this example, a connection between AV devices 110, 150 is supported by AV switches 120, 130, 140. If each of AV devices 110, 150 and AV switches 120, 130, 140 support network synchronization, then a connection having a certain QoS can be reserved between AV devices 110, 150. In contrast, if any of AV devices 110, 150 and AV switches 120, 130, 140 do not support network synchronization, then a connection having a certain QoS cannot be reserved between AV devices 110, 150.

Figure 2:
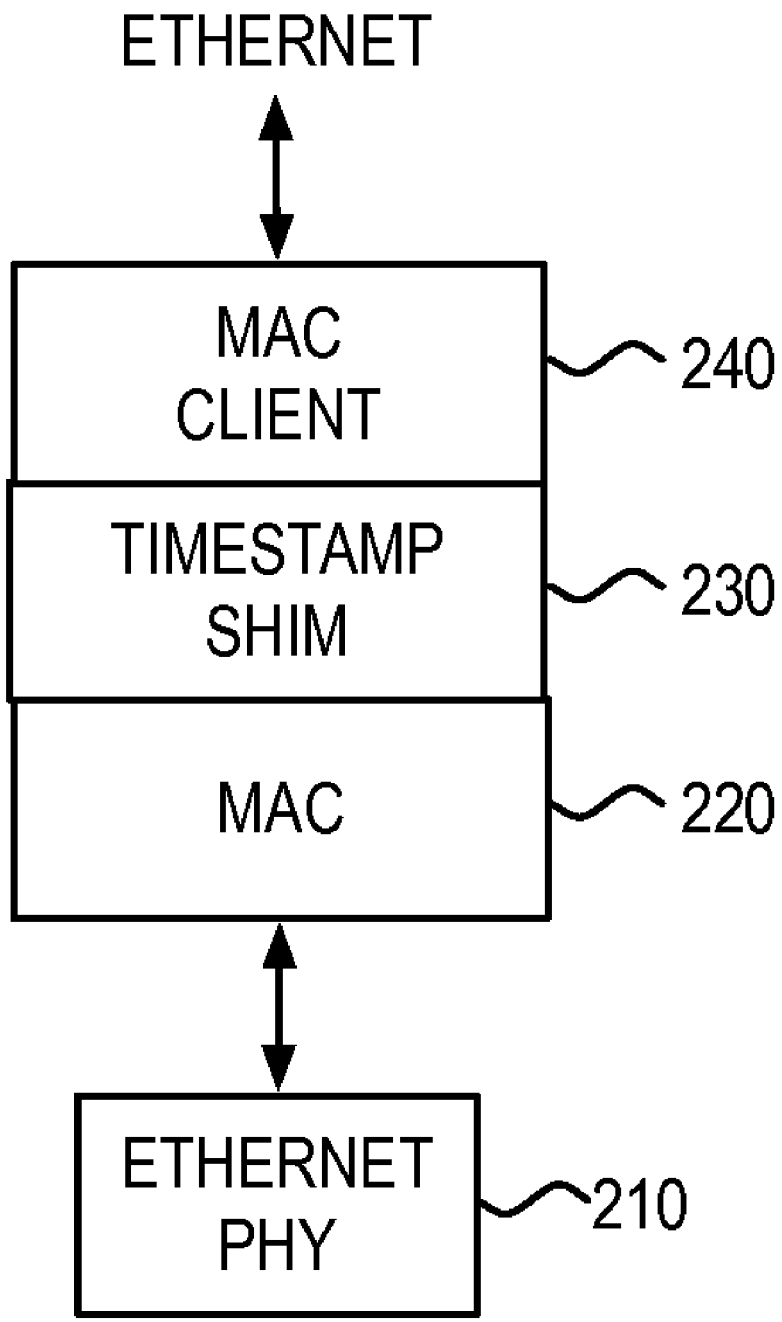
FIG. 2 illustrates an embodiment of a device that supports network synchronization.

FIG. 2 illustrates an embodiment of a device that enables network synchronization. As illustrated, the device would include timestamp shim 230, which is designed to generate timestamps based on a common time reference that has been established between devices such as that exemplified in FIG. 1. Ethernet signals that include such timestamps are sent to a receiving network device through media access controller (MAC) 220 and Ethernet PHY 210. In various embodiments, one or more MAC clients 240 can be used that can be coupled to an I/O controller, graphics subsystem, etc. When operating as an end device, MAC client 240 can include a traffic classifier and scheduler.

In general, AV switches can be designed to include multiple MACs and PHYs, while also including admission controller, frame filtering/routing, and time synchronization services. Additional details of such services are exemplified by IEEE 802.1AS, which provides a time synchronization protocol; IEEE 802.1Qat, which provides a stream reservation protocol; and IEEE 802.1Qav, which provides for guaranteed latency and bandwidth for established streams.

One of the limitations of link delay measurements is the time synchronization granularity. For typical Ethernet connection speeds, the time synchronization granularity is <40 ns. At this time synchronization granularity, the cable length uncertainty for the media propagation speed of Ethernet cable is on the order of ±8 m. As a typical Ethernet cable length is less than 100 m, this cable length uncertainty can represent a significant accuracy limitation for the link delay measurement technique. Another limitation of link delay measurements is that the link needs to be active for network synchronization to occur.

Figure 3:
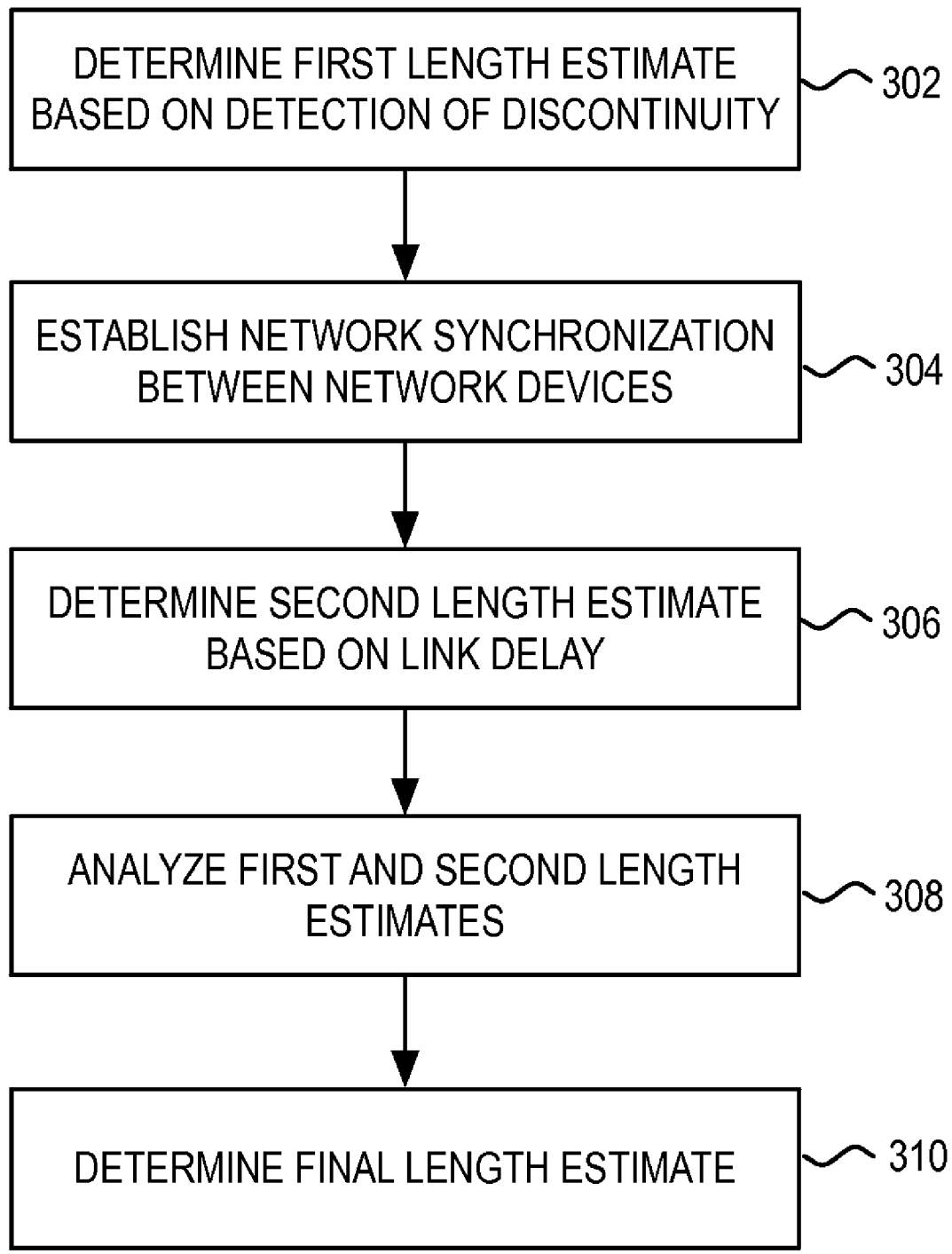
FIG. 3 illustrates a flowchart of a process of generating a cable length estimate.

In the present invention, it is recognized that neither the link delay measurement technique nor the TDR technique can be used on their own for accurate cable diagnostics. It is therefore a feature of the present invention that the two techniques can be used in combination to produce a more accurate and reliable cable length estimate. In typical device implementations, both the link delay measurement and TDR techniques are performed by the same subsystem of the device. Accordingly, consideration of the results of both techniques can be performed by a process such as that illustrated in the flowchart of FIG. 3.

As illustrated, the process begins at step 302 where a first length estimate is determined based on detection of a discontinuity. As noted above, this length estimate can be generated using TDR or other measurements that examine the reflection of a signal that is inserted into the cable.

Next, at step 304, network synchronization is established between network devices. In one embodiment, the network synchronization is enabled through AV bridging technology such as that described above. In general, any network synchronization protocol that establishes a common time reference between devices can be used. Here, it should be noted that the network synchronization is established between at least the two devices that are on either end of the cable being measured. While the network synchronization can be established between multiple devices that create a link over multiple hops (e.g., peer devices along with intermediate bridge/switch devices such as that illustrated in FIG. 1), the network synchronization would enable link delay measurements over a single hop.

After network synchronization is established at step 304, a second length estimate is determined based on a link delay measurement at step 306. Regardless of the relative timing in generating the length estimates, the two length estimates can be used to generate a more accurate and/or reliable length estimate. In one embodiment, an analysis of the first and second length estimates is performed at step 308. Here, the analysis can consider whether the first and second length estimates are wildly divergent. For example, the first length estimate can be seriously deficient if the cable is perfectly terminated. In another example, the second length estimate can be seriously deficient if a network synchronization error has occurred. In the case of wildly divergent results (e.g., results that differ by an amount far greater than the length measurement uncertainty), the system can be designed to eliminate one of the results and report the other length estimate as the final length estimate at step 310.

Where the two length estimates are not wildly divergent, the system can be designed to combine the two length estimates into the final length estimate. For example, at step 310, the system can choose to simply average the two length estimates. In another example, the system can choose to weight the two length estimates should there be indications that one of the length estimates is based on questionable readings.

In various implementations, one of the length estimates can be eliminated or weighted more than the other length estimate based on various criteria such as application used, accuracy desired, repeated readings on each type of application, clock considerations, etc.

Regardless of the method by which the length estimates are combined, the combination will produce a more accurate result across a variety of operating conditions. Where the length result is used in some form of system configuration (e.g., PoE), improvements in system operation would also result.

It should be noted that the principles of the present invention can apply to various PHY speeds such as 10BASE-T, 100BASE-TX, 1000BASE-T, 10 GBASE-T, etc, apply to non-standard PHY speeds such as 2.5 G, 5 G, etc., or apply to various cable types such as Cat 3, 5, 5e, 6 and 7. Also, the principles of the present invention would not be dependent on clock resolutions within the network synchronization scheme.

These and other aspects of the present invention will become apparent to those skilled in the art by a review of the preceding detailed description. Although a number of salient features of the present invention have been described above, the invention is capable of other embodiments and of being practiced and carried out in various ways that would be apparent to one of ordinary skill in the art after reading the disclosed invention, therefore the above description should not be considered to be exclusive of these other embodiments. Also, it is to be understood that the phraseology and terminology employed herein are for the purposes of description and should not be regarded as limiting.

What is claimed is:

1. A cable diagnostic method, comprising:
    determining a first estimate of a length of a cable between a first and a second node based on a detection of a reflection at a discontinuity in said cable;
    establishing a common time reference between said first and said second node using a time synchronization protocol that exchanges timing information between said first and said second node;
    determining a second estimate of said length of said cable based on a link delay measurement that is based on a passage of one or more messages, which include a timestamp, between said first and said second nodes; and
    determining a final estimate of said length of said cable upon consideration of said first estimate and said second estimate.

2. The method of claim 1, wherein said common time reference is established using a connection reservation protocol.

3. The method of claim 1, wherein said link delay measurement is based on a difference of a packet transmission time and a packet reception time in a one-way trip.

4. The method of claim 1, wherein said final estimate is selected from one of said first estimate and said second estimate.

5. The method of claim 1, wherein said final estimate is an average of said first estimate and said second estimate.

6. The method of claim 1, wherein said final estimate is a weighted average of said first estimate and said second estimate.

7. The method of claim 1, wherein said final estimate is determined based on consideration of an application or accuracy.

8. A network device, comprising:
    a physical layer device that performs time domain reflectometry measurements on a cable coupled to an Ethernet port;
    a timestamp shim that has a common time reference with a second network device connected to said cable; and
    a controller that determines a first estimate of a length of said cable using said time domain reflectometry measurements and a second estimate of said length of said cable based on a link delay measurement that uses Ethernet messages from said second network device, said control further determining a final estimate of said length of said cable upon consideration of said first estimate and said second estimate.

9. The network device of claim 8, wherein said common time reference is established using a connection reservation protocol.

10. The network device of claim 8, wherein said link delay measurement is based on a difference of a packet transmission time and a packet reception time.

11. The network device of claim 8, wherein said final estimate is selected from one of said first estimate and said second estimate.

12. The network device of claim 8, wherein said final estimate is an average of said first estimate and said second estimate.

13. The network device of claim 8, wherein said final estimate is a weighted average of said first estimate and said second estimate.

14. The method of claim 8, wherein said timestamp shim is between a media access control and a media access control client.

15. A cable diagnostic method in a node of a network, comprising:
    determining a first estimate of a length of a cable based on time domain reflectometry measurements recorded by a physical layer device;
    determining a second estimate of said length of said cable based on a link delay measurement recorded by a media access controller, said link delay measurement being based on a receipt of a message from a second node in a network having a common time reference; and
    determining a final estimate of said length of said cable upon consideration of said first estimate and said second estimate.

16. The method of claim 15, wherein said common time reference is established using a connection reservation protocol.

17. The method of claim 15, wherein said link delay measurement is based on a difference of a packet transmission time and a packet reception time.

18. The method of claim 15, wherein said final estimate is selected from one of said first estimate and said second estimate.

19. The method of claim 15, wherein said final estimate is an average of said first estimate and said second estimate.

20. The method of claim 15, wherein said final estimate is a weighted average of said first estimate and said second estimate.

* * * * *